(12) United States Patent
Matsuda et al.

(10) Patent No.: US 8,137,461 B2
(45) Date of Patent: Mar. 20, 2012

(54) PIEZOELECTRIC SUBSTRATE, PIEZOELECTRIC ELEMENT, LIQUID DISCHARGE HEAD AND LIQUID DISCHARGE APPARATUS

(75) Inventors: Takanori Matsuda, Tokyo (JP); Toshihiro Ifuku, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 393 days.

(21) Appl. No.: 12/554,238

(22) Filed: Sep. 4, 2009

(65) Prior Publication Data

US 2009/0320256 A1    Dec. 31, 2009

Related U.S. Application Data

(62) Division of application No. 11/464,565, filed on Aug. 15, 2006, now abandoned.

(30) Foreign Application Priority Data

Aug. 23, 2005  (JP) ................................. 2005-241378

(51) Int. Cl.
*C30B 25/06*  (2006.01)

(52) U.S. Cl. .............. 117/103; 117/84; 117/88; 117/92; 117/108; 117/947; 310/358

(58) Field of Classification Search ..................... 117/84, 117/88, 92, 103, 108, 947; 310/358
See application file for complete search history.

(56) References Cited

U.S. PATENT DOCUMENTS

| | | | |
|---|---|---|---|
| 6,221,271 B1 | 4/2001 | Watanabe et al. | ...... 262/62.9 PZ |
| 6,653,211 B2 | 11/2003 | Unno et al. | |
| 6,854,832 B2 | 2/2005 | Matsuda. | |
| 6,927,084 B2 | 8/2005 | Fukui et al. | |
| 7,045,935 B2 | 5/2006 | Matsuda et al. | |
| 7,053,526 B2 | 5/2006 | Unno et al. | |
| 7,059,711 B2 | 6/2006 | Aoto et al. | |
| 7,120,978 B2 | 10/2006 | Wasa et al. | |
| 7,144,101 B2 | 12/2006 | Ifuku et al. | |
| 7,229,662 B2 * | 6/2007 | Wang et al. | ................... 427/100 |
| 7,309,950 B1 | 12/2007 | Aoki et al. | |
| 7,528,530 B2 | 5/2009 | Matsuda et al. | |
| 2003/0234835 A1 * | 12/2003 | Torii et al. | ........................ 347/68 |
| 2004/0084994 A1 | 5/2004 | Iwashita et al. | ............... 310/311 |
| 2004/0155559 A1 | 8/2004 | Ifuku et al. | |
| 2004/0207288 A1 * | 10/2004 | Funakubo et al. | ............ 310/311 |

(Continued)

FOREIGN PATENT DOCUMENTS

JP    62-213399    9/1987

(Continued)

*Primary Examiner* — Matthew Song
(74) *Attorney, Agent, or Firm* — Fitzpatrick, Cella, Harper & Scinto

(57) ABSTRACT

A piezoelectric substrate of a perovskite-type oxide is expressed by a general formula of $ABO_3$ having a laminate structure of a single crystal structure or a uniaxial crystal structure expressed by $(Pb_{1-x}M_x)_{xm}(Zr_yTi_{1-y})O_3$ (where M represents an element selected from La, Ca, Ba, Sr, Bi, Sb and W). The laminate structure has a first crystal phase layer having a crystal structure selected from a tetragonal structure, a rhombohedral structure, a pseudocubic structure and a monoclinic structure, a second crystal phase layer having a crystal structure different from the crystal structure of said first crystal phase layer and a boundary layer arranged between the first crystal phase layer and the second crystal phase layer with a crystal structure gradually changing in a thickness direction of the layer. The thicknesses of the first and second crystal phase layer differ.

3 Claims, 5 Drawing Sheets

$T_1 \neq T_2 \neq T_3$

U.S. PATENT DOCUMENTS

| | | |
|---|---|---|
| 2005/0127780 A1 | 6/2005 | Ifuku et al. |
| 2005/0168112 A1 | 8/2005 | Aoki et al. |
| 2005/0189849 A1 | 9/2005 | Ifuku et al. |
| 2005/0219793 A1 | 10/2005 | Matsuda et al. |
| 2006/0033404 A1 | 2/2006 | Fukui et al. |
| 2006/0049135 A1 | 3/2006 | Okabe et al. |
| 2007/0046152 A1 | 3/2007 | Ifuku et al. |
| 2007/0046154 A1 | 3/2007 | Ifuku et al. |
| 2007/0046734 A1 | 3/2007 | Aoki et al. |
| 2007/0048190 A1 | 3/2007 | Ifuku et al. |
| 2007/0060467 A1 | 3/2007 | Matsuda et al. |
| 2007/0190363 A1 | 8/2007 | Wang et al. .................. 428/800 |
| 2007/0215715 A1 | 9/2007 | Fukui et al. |
| 2008/0012054 A1 | 1/2008 | Ifuku et al. |

FOREIGN PATENT DOCUMENTS

| | | |
|---|---|---|
| WO | 2005/083809 | 9/2005 |

* cited by examiner $T_1 \neq T_2 \neq T_3$

PIEZOELECTRIC SUBSTRATE, PIEZOELECTRIC ELEMENT, LIQUID DISCHARGE HEAD AND LIQUID DISCHARGE APPARATUS

This is a division of U.S. patent application Ser. No. 11/464,565, filed Aug. 15, 2006, now abandoned.

BACKGROUND OF THE INVENTION

1. Field of the Invention

The present invention relates to a piezoelectric substrate, a piezoelectric element and a liquid discharge head to be used for a liquid discharge apparatus and also to methods of manufacturing the same. More particularly, the present invention relates to a high density piezoelectric element having a large area and a liquid discharge head using such an element.

2. Description of the Related Art

There is an increasing demand for long printing heads to be used in ink jet printers in order to improve the resolution and the printing speed of such printers. For this reason, there is a demand for micronized multi-nozzle head structures. Then, piezoelectric elements for discharging liquid are required to be downsized in order to micronize liquid discharge heads. Then, piezoelectric substrates showing a high piezoelectric constant are required in order not to reduce the drive power if liquid discharge heads are micronized. Thus, there is a demand for highly crystalline piezoelectric films as piezoelectric substrates. Such piezoelectric films are required to show a controlled crystallinity so as to contain highly oriented crystals. For a piezoelectric film to be a highly oriented crystal, it is preferable that the directly underlying layer is highly crystalline and the piezoelectric film and the directly underlying layer make a good combination in terms of lattice matching at the time of manufacturing the piezoelectric film.

Additionally, the piezoelectric film and the directly underlying layer are apt to give rise to a phenomenon of film exfoliation when stress is applied to the interface if the piezoelectric film is made thin. Therefore, the directly underlying layer is required to be highly adhesive relative to the piezoelectric film in order to suppress such film exfoliation.

Conventionally, paste of powdery PbO, $ZrO_2$ and $TiO_2$ is molded to form green sheets, which are then sintered to produce a PZT type piezoelectric material for piezoelectric films to be used for piezoelectric elements as described in Japanese Patent Application Laid-open No. S62-213399.

However, it is difficult to produce PZT type oxide films with a thickness of not greater than 10 μm by means of the method disclosed in Japanese Patent Application Laid-open No. S62-213399. Additionally, since such green sheets are sintered at a temperature level not lower than 1,000° C., there arises a problem that the piezoelectric films shrink to 70% of the original size. Then, it is difficult to align a piezoelectric film and a structure such as an ink chamber with an accuracy level of several microns. Thus, no satisfactory micro piezoelectric elements have been available to date.

Furthermore, the influence of the crystal grain boundaries becomes unnegligible as ceramic piezoelectric films formed by sintering green sheets show a reduced thickness to consequently make it impossible to realize good piezoelectric characteristics. As a result, there arises a problem of being unable to obtain piezoelectric characteristics that are satisfactory for causing a piezoelectric film to operate for discharging recording liquid if the piezoelectric film is prepared by sintering a green sheet to a thickness not greater than 10 μm.

Known methods for preparing piezoelectric films include sputtering methods, CVD methods, MBE methods and sol-gel methods in addition to the above cited method. As a matter of fact, it is possible to produce a thin oxide film with a film thickness of not greater than 10 μm by means of any of such methods. However, since the piezoelectric film prepared by means of any of such methods shows a high density to by turn give rise to very large in-plane stress and make the piezoelectric film poorly adhesive to the underlying layer, which is a lower electrode. For the piezoelectric elements of an ink jet head to withstand the stress produced when they are driven repeatedly, it is necessary that the piezoelectric film is highly adhesive to the underlying layer of a lower electrode. However, a piezoelectric film prepared by any of the above-cited methods cannot be feasibly used as piezoelectric element for ink jet recording.

Additionally, if the piezoelectric characteristics of a piezoelectric material fluctuate due to temperature change, the temperature of the operation environment needs to be held to a constant level, although the temperature requirement may vary depending on the type of piezoelectric material. In other words, a piezoelectric material that is lowly temperature-dependent and shows excellent piezoelectric characteristics when used as piezoelectric element has not been found to date.

SUMMARY OF THE INVENTION

In view of the above identified circumstances, it is therefore an object of the present invention to provide a piezoelectric substrate that shows a controlled crystallinity and an enhanced level of orientation to realize excellent piezoelectric characteristics and produces an enhanced level of adhesiveness between the piezoelectric substrate and an electrode to make itself highly durable and capable of suppressing any possible film exfoliation as well as a piezoelectric element, a liquid discharge head and a liquid discharge apparatus realized by using such a piezoelectric substrate.

Another object of the present invention is to provide a piezoelectric substrate whose piezoelectric characteristics do not degrade by the temperature change in the operation environment as well as a piezoelectric element, a liquid discharge head and a liquid discharge apparatus realized by using such a piezoelectric substrate.

Still another object of the present invention is to provide a method of manufacturing a piezoelectric substrate that utilizes micro-processing techniques available in the field of semiconductor processes and a highly reliable liquid discharge head having densely arranged discharge ports prepared by means of such a method.

According to the present invention, the above objects and other objects of the invention are achieved by providing a piezoelectric substrate of a perovskite-type oxide expressed by a general formula of $ABO_3$ having a laminate structure of a single crystal structure or a uniaxial crystal structure expressed by $(Pb_{1-x}M_x)_{xm}(Zr_yTi_{1-y})O_3$ (where M represents an element selected from La, Ca, Ba, Sr, Bi, Sb and W), the laminate structure having a layered first crystal phase having a crystal structure selected from the tetragonal structure, the rhombohedral structure, the pseudocubic structure and the monoclinic structure, a layered second crystal phase having a crystal structure selected from the tetragonal structure, the rhombohedral structure, the pseudocubic structure and the monoclinic structure but different from the crystal structure of said first crystal phase and a boundary layer arranged between said first crystal phase and said second crystal phase with a crystal structure gradually changing in a width or thickness direction of the layer.

According to the present invention, there are also provided a piezoelectric element comprising a piezoelectric substrate as defined above and a pair of electrode, a liquid discharge head comprising such a piezoelectric element and a liquid discharge apparatus comprising such a head.

Thus, a piezoelectric substrate according to the present invention is highly durable and capable of suppressing any possible film exfoliation and produces an enhanced level of adhesiveness between the piezoelectric substrate and an underlying layer, showing a controlled crystallinity and an enhanced level of orientation to realize excellent piezoelectric characteristics. Additionally, a piezoelectric substrate according to the invention shows piezoelectric characteristics that do not degrade by the temperature change in the operation environment. Thus, a piezoelectric substrate according to the present invention shows excellent piezoelectric characteristics when it is used in a high density piezoelectric element and a liquid discharge head.

A method of manufacturing a piezoelectric substrate can manufacture a highly reliable piezoelectric substrate by utilizing micro-processing techniques available in the field of semiconductor processes that leads to a method of manufacturing a high density piezoelectric element and a method of manufacturing a highly reliable liquid discharge head.

Further features of the present invention will become apparent from the following description of exemplary embodiments with reference to the attached drawings.

DESCRIPTION OF THE EMBODIMENTS

A piezoelectric substrate according to the present invention has a single crystal structure or a uniaxial crystal structure of a perovskite-type oxide expressed by a general formula of $ABO_3$. The piezoelectric substrate has a laminate structure having a plurality of layered crystal phases, each including a crystal structure selected from the tetragonal structure, the rhombohedral structure, the pseudocubic structure and the monoclinic structure. The crystal phase is expressed by $(Pb_{1-x}M_x)_{xm}(Zr_yTi_{1-y})O_3$ (where M represents an element selected from La, Ca, Ba, Sr, Bi, Sb and W). A piezoelectric substrate according to the present invention is additionally characterized in that it additionally comprises a crystal phase (boundary layer) arranged between different crystal phases with a crystal structure gradually changing in the direction of elevation. Each of the crystal phases is obtained typically by epitaxial growth and has a laminate structure, although it shows a single crystal structure or a uniaxial crystal structure as a whole.

Figure 1:
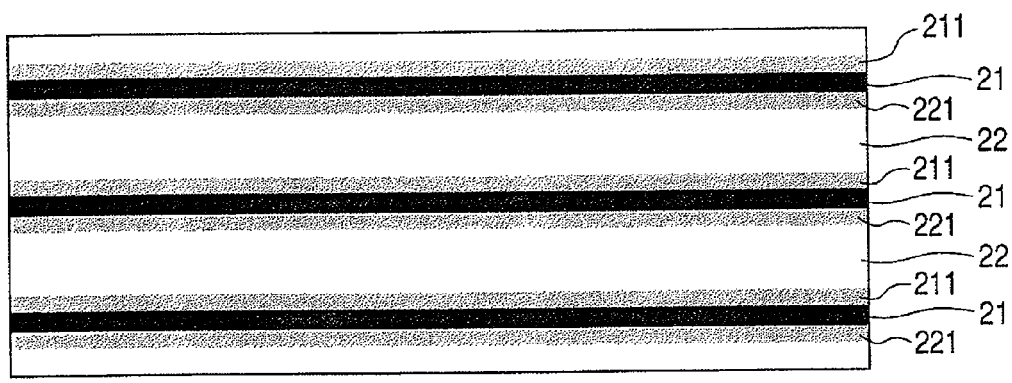
FIG. 1 is a schematic illustration of an embodiment of piezoelectric substrate according to the invention, showing the laminate structure thereof.

FIG. 1 schematically illustrates exemplary boundary layers 211, 222 having a crystal structure that changes gradually in the direction of elevation or thickness, each being arranged between a first crystal phase 21 and a second crystal phase 22 having predetermined perspective crystal structures.

For example, for the purpose of the present invention, a crystal phase (boundary layer) as described below may be arranged between a first crystal phase 21 of the tetragonal structure having a single crystal structure and a second crystal phase 22 of the rhombohedral structure having a single crystal structure. In other words, a crystal phase 211 is arranged between a first crystal phase 21 and a second crystal phase 22 so as to gradually change its crystal structure from the tetragonal structure to the rhombohedral structure from the side of the crystal phase 21 toward the crystal phase 22. Additionally, a crystal phase 221 is arranged between a second crystal phase 22 and a first crystal phase 21 so as to gradually change its crystal structure from the rhombohedral structure to the tetragonal structure from the side of the crystal phase 22 toward the crystal phase 21. Such an arrangement can uniformly disperse and absorb strain from biased directions and hence can suppress exfoliation of film if the film thickness is of the order of microns that is apt to give rise to exfoliation. In other words, it is possible to obtain a piezoelectric substrate that realizes a strong adhesion between the piezoelectric film and the electrodes and makes itself highly durable and capable of suppressing any possible film exfoliation. Thus, it is possible to alleviate the stress applied to each of the crystal phase layers of the piezoelectric substrate and hence improve the durability of the piezoelectric substrate.

When a specific phase is damaged in a piezoelectric substrate to give rise to fine cracks or the like, the cracks can spread if the piezoelectric substrate has a single crystal phase layer. However, with the arrangement of this embodiment, a plurality of crystal phase layers having respective Young's moduli that are different from each other are laid one on the other to form a multilayer structure and hence the cracks produced in a layer having a large Young's modulus can hardly spread into layers having a large Young's modulus located beyond a layer having a small Young's modulus. In short, cracks can hardly spread and hence the piezoelectric substrate shows a high durability as a whole. Additionally, with the arrangement of this embodiment, the crystal phases having different compositions can disperse and absorb the stresses applied to the films themselves in the phase changes that arise as the films are cooled from the film forming temperature to the room temperature in the film forming process. Still additionally, a specific crystal phase absorbs strain in each specific temperature range so that the piezoelectric substrate shows excellent piezoelectric characteristics over a wide temperature range as a whole.

Figure 2:
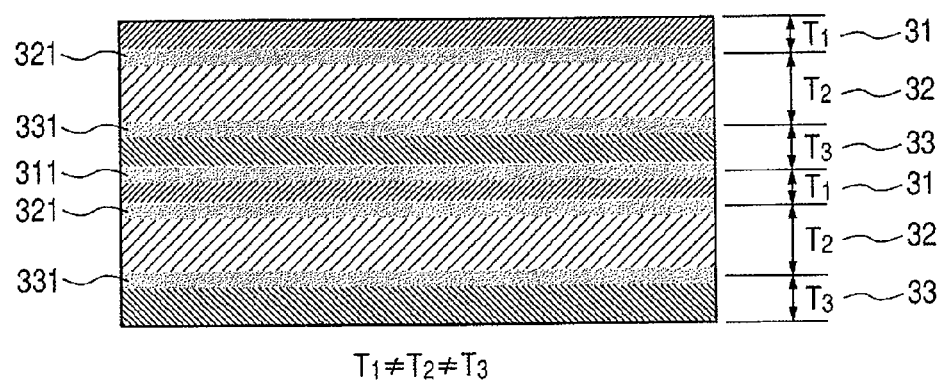
FIG. 2 is a schematic illustration of another embodiment of piezoelectric substrate according to the invention, showing the laminate structure thereof.

In the laminate structure of this embodiment of piezoelectric substrate, at least two of the layers of the crystal phases preferably have different respective thicknesses. For example, as shown in FIG. 2, the piezoelectric substrate may have crystal phase 31 having film thickness $T_1$, crystal phase 32 having film thickness $T_2$ and crystal phase 33 having film thickness $T_3$, where $T_1$, $T_2$ and $T_3$ differ from each other. Boundary layers (311, 321, 331) are arranged to separate the crystal phases from each other. The boundary layers gradually change their respective crystal structures as described above by referring to FIG. 1. The expression of film thickness $T_1$, $T_2$ and $T_3$ as used herein refers to the distance from the center of a boundary layer to the center of the next boundary layer. For the purpose of the present invention, in a piezoelectric substrate having a laminate structure, the layer of the crystal phase that is most suitable for the operating conditions of the piezoelectric substrate preferably has a sufficiently large film thickness. Then, the stress applied to the piezoelectric substrate can be alleviated by the layers of the other crystal phases. In a piezoelectric substrate where the layers of the crystal phases have different film thicknesses, the thicknesses of the crystal phases may be determined according to the operating conditions to make the piezoelectric substrate adapted to the operating conditions. While each of the boundary layers preferably gradually changes its structure, it may be a mixed phase of the crystal phases that are separated by the boundary layer and held in contact with it.

A piezoelectric substrate having such a laminate structure has crystal phases of two or more than two different types of crystal structure selected from the tetragonal structure, the rhombohedral structure, the pseudocubic structure and the monoclinic structure. Each of the crystal phases is expressed by $(Pb_{1-x}M_x)_{xm}(Zr_yTi_{1-y})O_3$ (where M represents an element selected from La, Ca, Ba, Sr, Bi, Sb and W). Preferably, the above formula preferably satisfies the requirement of $0.45 \leq y < 1$. Still preferably, the above formula preferably satisfies the requirements of $0 \leq x \leq 0.10$ and $0 \leq xm \leq 1.3$. It is advantageously possible to form boundary layers as mixed phases when the above requirements are satisfied.

Each of the crystal phases of the laminate structure of this embodiment of piezoelectric body preferably has a film thickness of not less than 1 nm and not more than 1,000 nm. It is possible to provide the piezoelectric substrate with satisfactory piezoelectric characteristics when the film thickness is not less than 1 nm and suppress the exfoliation that arises due to the applied in-plane stress of the laminate structure when the film thickness is not more than 1,000 nm.

[Piezoelectric Element]

Figure 3:
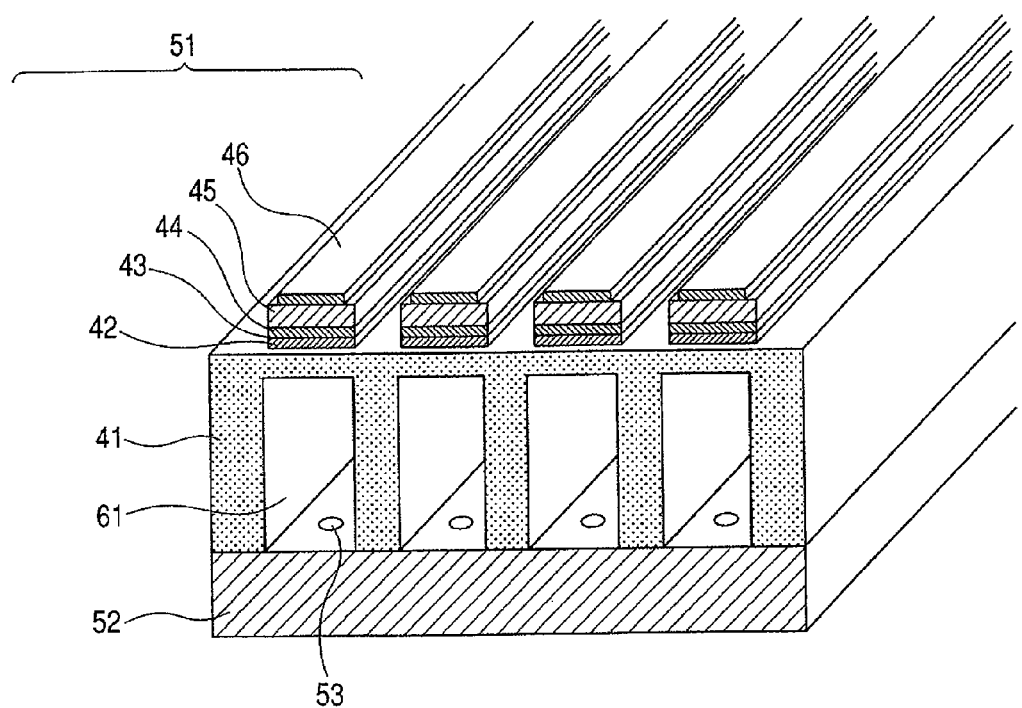
FIG. 3 is a schematic cross-sectional perspective view of an embodiment of liquid discharge head according to the invention.

A piezoelectric element according to the invention can be embodied without particular limitations so long as it comprises a piezoelectric substrate according to the invention as described above by referring to the preferred embodiment and a pair of electrodes arranged in contact with the piezoelectric substrate. FIG. 3 schematically illustrates an embodiment of piezoelectric element. Referring to FIG. 3, the piezoelectric element 51 has a laminate structure formed by sequentially laying a base member 41, a vibration plate 42, a buffer layer 43, a lower electrode 44, a piezoelectric substrate 45 and an upper electrode 46.

The base member of the piezoelectric element of this embodiment is preferably made of a crystalline material, which is preferably Si. Specific examples of materials containing Si include SOI having an $SiO_2$ film formed on Si. The base member typically has a thickness between 100 and 1,000 μm.

The diaphragm is arranged to transmit the displacement of the piezoelectric substrate. Preferably, the vibration plate shows an enhanced degree of lattice matching relative to the base member and a large Young's modulus so as to operate satisfactorily. When the base member is made of silicon oxide, the vibration plate is preferably made of stabilized zirconia. When the base member is made of SOI, the $SiO_2$ layer formed on Si single crystal layer may be used as vibration plate. The vibration plate typically has a thickness of 2 to 10 μm.

The buffer layer is provided to take the role of enhancing the lattice matching between the crystal lattice constant of the base member and that of the piezoelectric substrate so that it may be omitted when the lattice matching between the base member and the piezoelectric substrate is satisfactory. The buffer layer may have a laminate structure formed by laying a plurality of layers so as to operate satisfactorily. The buffer layer is preferably made of a material that shows a good crystal lattice matching characteristic relative to the directly underlying vibration plate. Examples of materials that can be used for the buffer layer include stabilized zirconia YSZ ($Y_2O_3$—$ZrO_2$) and $CeO_2$ when the base member is made of silicon.

The lower electrode may be arranged directly on the buffer layer 43 or between the vibration plate 42 and the buffer layer 43. If the buffer layer is omitted, the lower electrode may also operate as buffer layer. If such is the case, an adhesion layer may be arranged between the lower electrode and the vibration plate in order to improve the adhesion between them. The lower electrode is preferably made of a metal of the platinum group or an electrically conductive material formed by using oxide of such a metal. Specific examples of materials that can be used for the lower electrode include metals of the platinum group such as Ru, Rh, Pd, Os, Ir and Pt and electrically conductive oxides of such metals such as $SrRuO_3$, $BaPbO_3$ and $RuO_3$. Examples of materials that can be used for the adhesion layer include metals such as Ti, Cr, Ir and oxides thereof such as $TiO_2$ and $IrO_2$.

Since the lower electrode 44 influences the orientated crystal bearing of the piezoelectric substrate that is arranged thereon, it is preferable that the priority oriented crystal bearing of the substrate surface of the lower electrode is (010), (101), (110) or (111). When the priority oriented crystal bearing of the substrate surface of the lower electrode is (010), (101), (110) or (111), the piezoelectric substrate 45 that is laid on the lower electrode 44 is oriented with a priority oriented crystal bearing of (100), (001), (010), (101), (110) or (111). The priority oriented crystal bearing of the substrate surface of the lower electrode is preferably (001) or (111) because the priority oriented crystal bearing of (001) or (111) is particularly advantageous for the piezoelectric characteristics of the piezoelectric substrate 45.

The crystal orientation ratio of the metal thin film or the thin film of the electrically conductive oxide material of the lower electrode is preferably not less than 70%. The crystal orientation ratio refers to the ratio relative to the peak intensity of the film as observed by means of a θ-2θ measurement of XRD (X-ray diffraction). The lower electrode shows good electric characteristics when the crystal orientation ratio of the metal electrode thin film is not less than 70% so that the piezoelectric substrate 45 arranged thereon shows an excellent crystallinity. Preferably, the crystal orientation ratio of the metal thin film or the electrically conductive oxide material of the lower electrode is not less than 85%. The film thickness of the lower electrode is preferably between 100 nm and 1,000 nm and that of the adhesion layer is preferably between 5 nm and 300 nm, more preferably between 10 nm and 70 nm.

The above-described embodiment of piezoelectric substrate is used in this embodiment of piezoelectric element. The film thickness of the piezoelectric substrate is preferably not less than 100 nm and not more than 10 μm, more preferably not less than 500 nm and not more than 8 μm. When the piezoelectric element is used in a liquid discharge head, it is highly durable relative to the stress that may arise when it is driven repeatedly if the film thickness of the piezoelectric substrate is not less than 100 nm. The piezoelectric element can suppress the phenomenon of film exfoliation if the film thickness of the piezoelectric substrate is not more than 10 μm.

The upper electrode 46 is arranged directly on the piezoelectric substrate 45 and electrically charges the piezoelectric substrate with the lower electrode. An adhesion layer made of a material similar to that of the adhesion layer arranged between the lower electrode and the vibration plate may also be arranged between the upper electrode and the piezoelectric substrate. The materials that can be used for the lower electrode can also be used for the upper electrode 46.

This embodiment of piezoelectric element may have a layer arrangement selected from those listed below. Each exemplary layer arrangement includes upper electrode 46//piezoelectric substrate 45//lower electrode 44//vibration plate 42 and each laminate structure is expressed by using /.

Example 1: Pt/Ti//PbZrTiO$_3$//Pt/Ti//YSZ(Y$_2$O$_3$—ZrO$_2$)/Si
Example 2: Au//PbZrTiO$_3$//Pt/Ti//YSZ(Y$_2$O$_3$—ZrO$_2$)/Si
Example 3: Pt/Ti//PbZrTiO$_3$/PbTiO$_3$//Pt/Ti//YSZ(Y$_2$O$_3$—ZrO$_2$)/Si
Example 4: Au/Cr//PbZrTiO$_3$/PbTiO$_3$//Pt/Ti//YSZ(Y$_2$O$_3$—ZrO$_2$)/Si
Example 5: Au/Cr//PbZrTiO$_3$//Pt/Ti//SiO$_2$/Si
Example 6: Au//PbZrTiO$_3$/PbTiO$_3$//Pt/Ti//YSZ(Y$_2$O$_3$—ZrO$_2$)/Si
Example 7: Pt/Ti//PbZrTiO$_3$//Pt/Ti//SiO$_2$/Si
Example 8: Au//PbZrTiO$_3$//Pt/Ti//SiO$_2$/Si
Example 9: Pt/Ti//PbZrTiO$_3$/PbTiO$_3$//Pt/Ti//SiO$_2$/Si
Example 10: Au//PbZrTiO$_3$/PbTiO$_3$//Pt/Ti//SiO$_2$/Si
Example 11: Pt//PbZrTiO$_3$//Pt/Ti//SiO$_2$/Si
Example 12: Au//PbZrTiO$_3$/PbTiO$_3$//Ir/Ti//SiO$_2$/Si
Example 13: Ir//PbZrTiO$_3$//Ir/Ti//SiO$_2$/Si
Example 14: Ir//PbZrTiO$_3$//Pt/Ti//SiO$_2$/Si
Example 15: Ir//PbZrTiO$_3$//Ir/Ti//SiO$_2$/Si
Example 16: Ir//PbZrTiO$_3$//Pt/Ti//SiO$_2$/Si

[Liquid Discharge Head]

A liquid discharge head according to the invention can be embodied without particular limitations so long as it comprises discharge ports, separate liquid chambers communicating respectively with the discharge ports, piezoelectric elements arranged to correspond to the respective separate liquid chambers and vibration plates arranged respectively between the separate liquid chambers and the piezoelectric elements. FIG. 3 is a schematic cross-sectional perspective view of an embodiment of liquid discharge head, which is an ink jet head. The ink jet head comprises a base member 41 and a plurality of pressure chambers 61 that are separate liquid chambers arranged in parallel with the base member. Each of the pressure chambers is provided with a liquid discharge port (discharge port) 53 and a piezoelectric element 51 along with a vibration plate 42 arranged between the pressure chamber and the piezoelectric element. The liquid discharge ports 53 of the ink jet head are disposed at predetermined regular intervals on a nozzle plate 52 arranged under the base member 41, although they may alternatively be disposed at a lateral surface side.

The piezoelectric elements 51 are typically arranged on the top surface of the base member 41 at respective positions that correspond to the pressure chambers 61. Each of the piezoelectric elements 51 is typically a laminate comprising a buffer layer 43, a lower electrode 44, a piezoelectric substrate 45 which is a piezoelectric thin film, and an upper electrode 46 that are laid sequentially one on the other in the above described order.

The embodiment of liquid discharge head of FIG. 3 is adapted to discharge liquid in the form of liquid droplets from each of the separate liquid chambers by means of the volume change produced in the liquid chamber by the vibration plate to which the displacement of the corresponding piezoelectric substrate is transmitted.

This embodiment of liquid discharge head can find applications not only in ink jet heads but also in liquid discharge sections of apparatus that are adapted to discharge liquid of various types.

In the liquid discharge head of the above described embodiment, the performances of the piezoelectric elements do not show remarkable variances because each of the piezoelectric elements comprises a vibration plate, a buffer layer, a lower electrode, a piezoelectric substrate and an upper electrode with their respective crystal orientation bearings aligned with each other. Thus, it is possible to realize a high adhesion device. Additionally, it is possible to achieve satisfactory piezoelectric characteristics and mechanical characteristics if the liquid discharge head is downsized. Additionally, the durability of the piezoelectric elements is improved to provide the liquid discharge head with excellent durability when the piezoelectric substrates are formed by using highly oriented crystal.

[Liquid Discharge Apparatus]

An embodiment of liquid discharge apparatus comprises the above-described embodiment of liquid discharge head.

Figure 4:
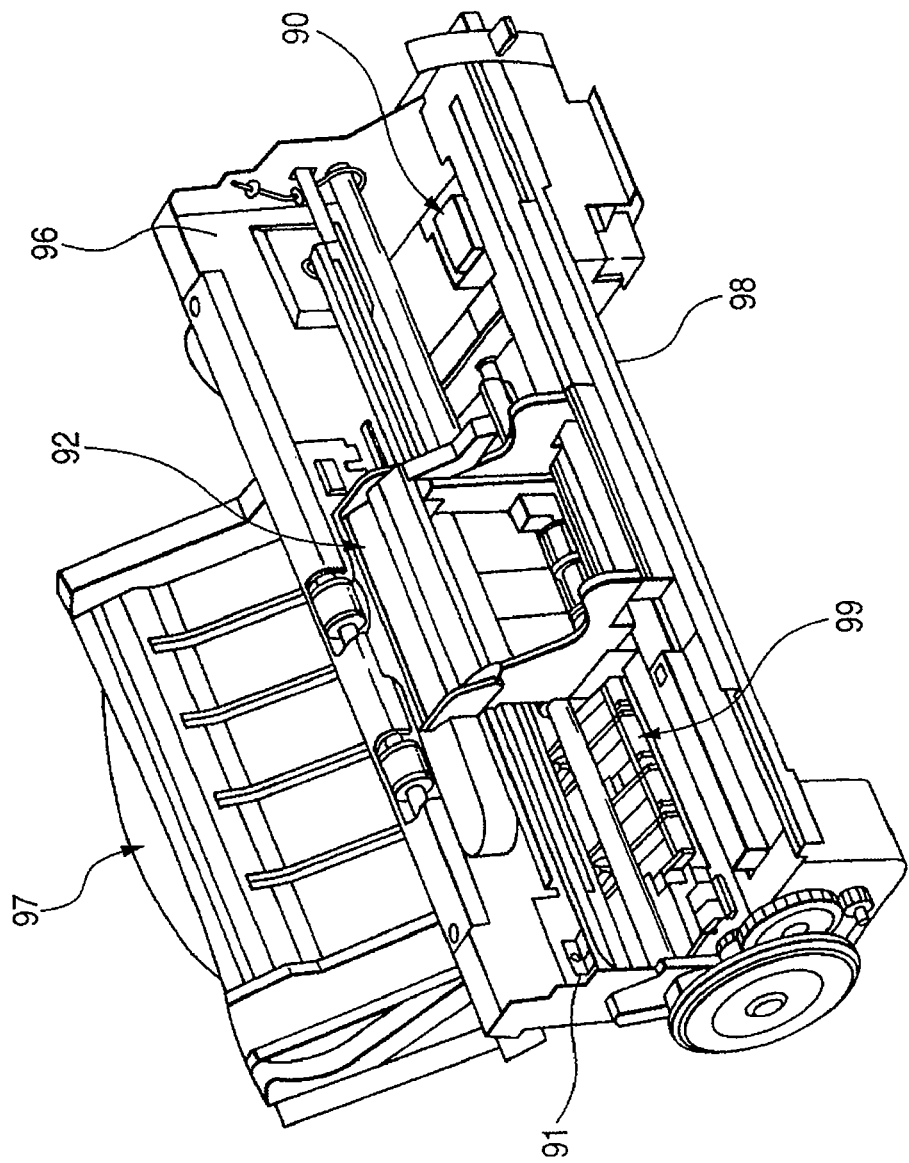
FIG. 4 is a schematic perspective view of an embodiment of liquid discharge apparatus according to the invention.

This embodiment of liquid discharge apparatus may be used as an ink jet recording apparatus. FIG. 4 is a schematic perspective view of an embodiment of liquid discharge apparatus according to the invention, which is an ink jet recording apparatus having an operation mechanism section. Referring to FIG. 4, the ink jet recording apparatus comprises an automatic feed section 97 for automatically feeding sheets of recording paper, or recording mediums, into the apparatus main section 96 along with a transfer section 99 for leading each sheet of recording paper fed from the automatic feed section 97 to a predetermined recording position and then from the recording position further to a delivery port 98, a recording section 91 for recording data on the sheet of recording paper transferred to the recording position and a recovery section 90 for executing a recovery process on the recording section 91. The recording section 91 is equipped with a carriage 92 that contains a liquid discharge head of this embodiment and drives it to move back and forth on a rail.

In the ink jet recording apparatus having the above-described configuration, the carriage 92 is driven to move on the rail according to electric signals transmitted from a computer and any of the piezoelectric substrates is displaced as a drive voltage is applied to the electrodes between which the piezoelectric substrate is sandwiched. Then, the corresponding pressure chamber is pressurized by the displacement of the piezoelectric substrate by way of the corresponding vibration plate so as to discharge ink from the discharge port for printing.

This embodiment of liquid discharge apparatus can uniformly discharge liquid droplets at high speed. Additionally, it is possible to downsize the apparatus.

While the embodiment is described above as a printer, the above-described embodiment of liquid discharge apparatus finds applications as ink jet recording apparatus of a fax machine, a composite machine or a copying machine and also as industrial liquid discharge apparatus.

[Method of Manufacturing Piezoelectric Substrate]

Figure 5:
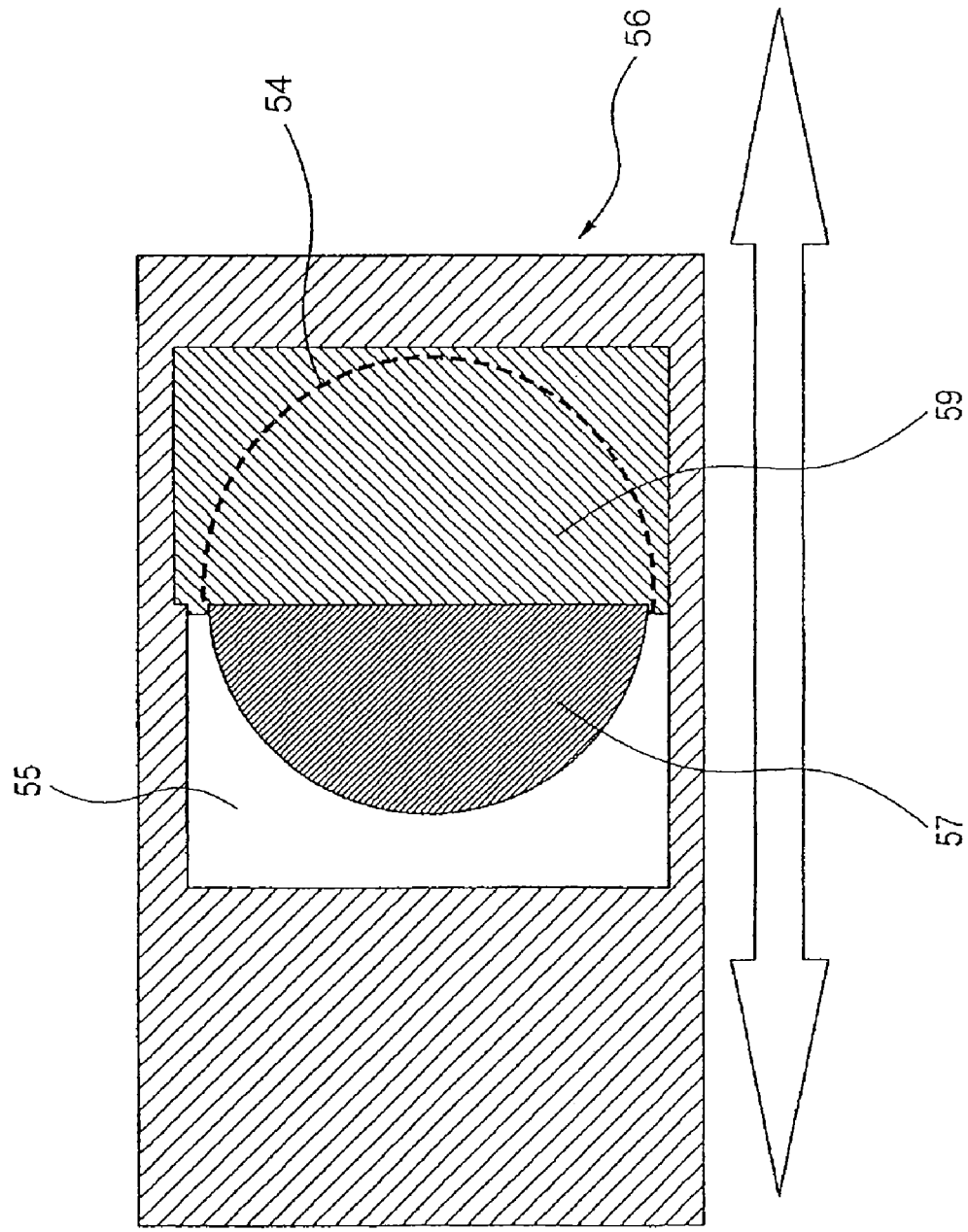
FIG. 5 is a schematic illustration of the relationship between a target and a shutter of a sputtering apparatus that can be used for manufacturing an embodiment of piezoelectric substrate according to the invention.
Figure 6:
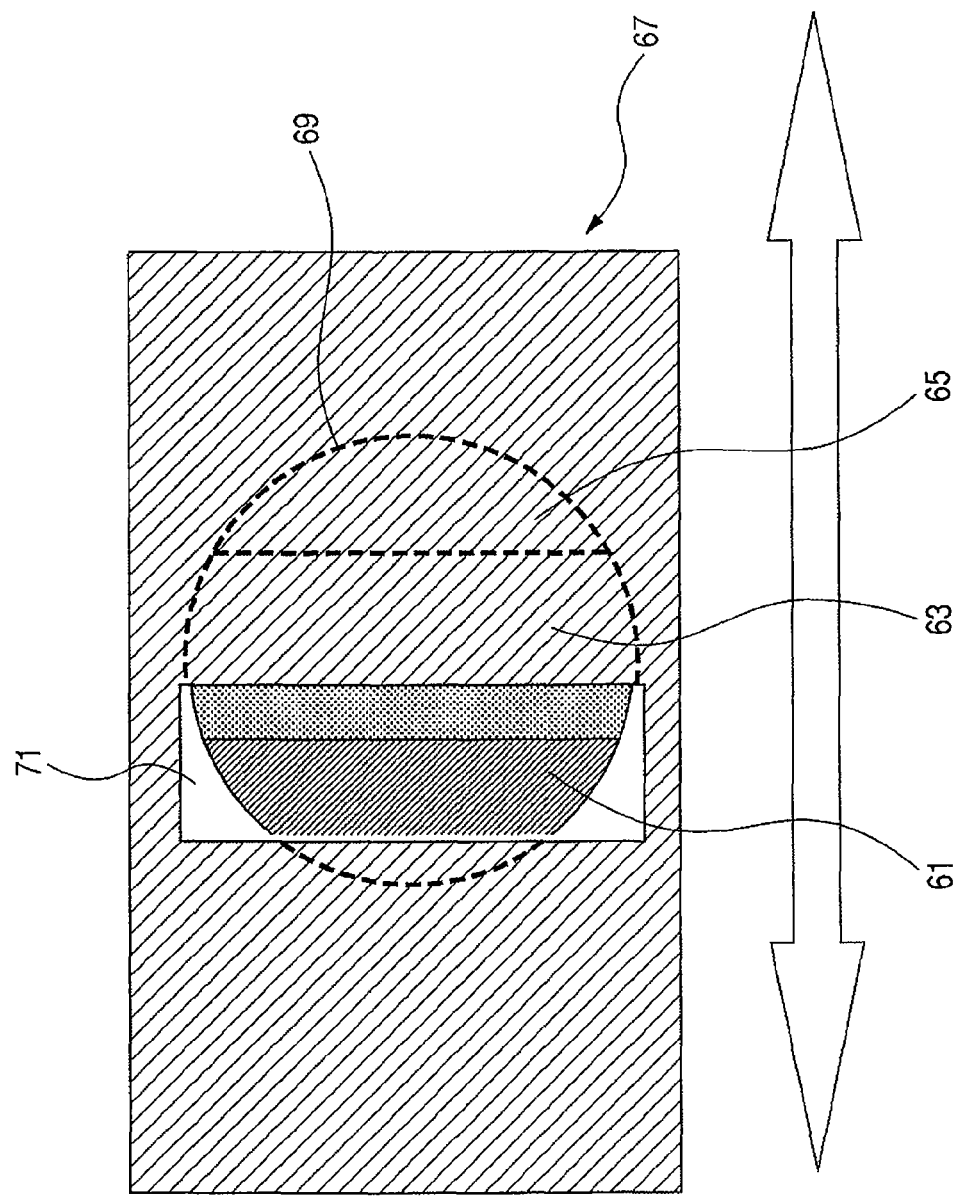
FIG. 6 is a schematic illustration of the relationship between a target and a shutter of a sputtering apparatus that can be used for manufacturing an embodiment of piezoelectric substrate according to the invention.

A piezoelectric substrate as shown in FIG. 1 can be manufactured by means of a film forming method of laying crystal phases having respective crystal structures that are different from each other one on the other and selecting piezoelectric materials that make each of the crystal phases show the tetragonal structure, the rhombohedral structure, the pseudocubic structure or the monoclinic structure. Preferably, each of the crystal phases is made to grow by sputtering. The crystal phases can be made to grow by sputtering by way of a step of arranging a target on which a plurality of different piezoelectric materials are arranged in different regions and a step of sputtering, shifting the sputtering area on said target. A technique of using a chamber where a base member for a piezoelectric substrate and a target of oxides expressed by the above formula of $(Pb_{1-x}M_x)_{xm}(Zr_yTi_{1-y})O_3$ that are to be used as piezoelectric materials for forming the crystal phases are arranged vis-à-vis may be employed for the sputtering. After producing a high degree of vacuum in the chamber, a voltage is applied between the base member and the target to produce a glow discharge and ionize gas such as argon gas introduced into the chamber. Then, ions are accelerated in a strong electric field to hit the target and the crystal phases are made to grow on the base member by means of the elements jumping out from the target. Particularly, when manufacturing a piezoelectric substrate by periodically repeating the process of laying different crystal phases, a target where two different piezoelectric materials of compositions 1 and 2 (targets 57, 59) for forming different crystal phases are arranged as shown in FIG. 5 may advantageously be used. Referring to FIG. 5, the aperture 55 of shutter 56 is arranged vis-à-vis the region of the corresponding piezoelectric material on the target 54. Then, only the region of the piezoelectric material to be used is sputtered by way of the aperture for a predetermined period of time to cause the corresponding element to jump out and form a film on the substrate. Subsequently, the shutter is moved slowly until the aperture comes vis-à-vis the region of the other piezoelectric material of the other composition for forming the next crystal phase and the region is sputtered. By repeating the above described process, it is possible to obtain a piezoelectric substrate having a laminate structure where two different compositions, or the crystal phases of two different types having different crystal structures, and boundary layers separating the crystal phases are laid one on the other. In FIG. 5, reference numeral 55 denotes the aperture section. When manufacturing a piezoelectric substrate having a laminate structure where crystal phases of three different types are periodically laid one on the other, three different piezoelectric materials of compositions 1, 2 and 3 (targets 61, 63, 65) for forming different crystal phases are arranged in respective regions on a target that are formed by dividing the overall target region into three. Then, it is possible to obtain a piezoelectric substrate having a laminate structure where three different compositions 1, 2 and 3, or the crystal phases of three different types having different crystal structures, and boundary layers separating the crystal phases are laid one on the other by sequentially and periodically placing the aperture of the shutter 67 vis-à-vis the regions of the piezoelectric materials and sputtering them. In FIG. 6, reference numeral 69 denotes the target and reference numeral 71 denotes the aperture section.

The oxides expressed by the above formula of $(Pb_{1-x}M_x)_{xm}(Zr_yTi_{1-y})O_3$ that are to be used on the target can be obtained by sintering or by means of a powder method of using powers prepared to respectively show desired compositions.

A layer having a crystal phase where the crystal structure gradually changes in the direction of elevation that is to be arranged between two layers of crystal phases having predetermined respective crystal structures is manufactured by regulating the moving speed of the shutter whose aperture is sequentially placed vis-à-vis the regions where different piezoelectric materials are arranged. It is possible to prepare a crystal phase whose crystal structure gradually changes by regulating the moving speed of the aperture of the shutter so as to form a film corresponding to the crystal structure that gradually changes in the direction of elevation of the piezoelectric substrate.

In this way, it is possible to obtain a piezoelectric substrate showing excellent piezoelectric characteristics when the piezoelectric substrate has a laminate structure of a plurality of layers but shows a single crystal structure or a uniaxial structure as a whole. Such a piezoelectric substrate can be obtained by forming the phases by epitaxial growth by means of the above-described technique.

[Method of Manufacturing Piezoelectric Element]

An appropriate thin film forming technique may be used for a method of manufacturing a piezoelectric element of this embodiment. Thin film forming techniques that can be used for forming a vibration plate 42 in the process of manufacturing a piezoelectric element according to the present invention include sputtering, CVD, laser abrasion and MBE. Particularly, the use of sputtering is advantageous because it is possible to produce an epitaxially grown oxide thin film on a base member 41 by sufficiently heating the film forming substrate in a heating process.

Thin film forming techniques that can be used for preparing a lower electrode 44 and an upper electrode to be laid on a base member 41 in the course of manufacturing a piezoelectric element include sputtering, CVD, PLD, Sol-Gel, MBE and hydrothermal synthesis. With any of these techniques, it is possible to form a film of an electrode material, orienting the electrode material in a specific direction.

Techniques that can be used for forming a film of a piezoelectric substrate 45 and growing the crystal of the film on a lower substrate 44 include sputtering, CVD, Sol-Gel, MBE and hydrothermal synthesis.

Techniques that can be used for forming a thin film of an upper electrode 46 on a piezoelectric substrate 45 include vapor phase techniques such as sputtering and evaporation coating, application techniques such as screen printing and liquid phase techniques such as plating.

Techniques similar to those that can be used for preparing an electrode may also be used for preparing a buffer layer for a piezoelectric element according to the present invention.

[Method of Manufacturing Liquid Discharge Head]

An appropriate thin film forming technique may be used for a method of manufacturing a liquid discharge head of this embodiment according to the present invention. When manufacturing a liquid discharge head of this embodiment, either a process of arranging separate liquid chambers (pressure chambers) 61 on the base member 41 of piezoelectric elements according to the present invention or a process of arranging separate liquid chambers that are separated from the base member and bonding them to piezoelectric elements.

With the former process, piezoelectric elements are formed by the above-described method and the base member 41 is partly removed at regular intervals to produce recesses for forming a plurality of separate liquid chambers. The recesses can be formed by wet etching that utilizes anisotropic etching or by dry etching such as ICP, LIGA process or bosch process. The pressure chambers may have an appropriate lateral profile selected from rectangular, circular, elliptic, etc. In the case of a side shooter, the pressure chambers may have a constricted profile having a tapered section directed toward the liquid discharge port. Then, a nozzle plate 52 where discharge ports 53 are bored is bonded to the base member where recesses are formed for pressure chambers 61. Alternatively, a nozzle plate where discharge ports 53 and recesses are formed may be bonded to the base member to prepare a liquid discharge head. The material of the nozzle plate may be same as or different from that of the base member to which the nozzle plate is to be bonded. Materials that can be used for the nozzle plate include SUS and Ni. Preferably, the material of the nozzle plate shows a thermal expansion coefficient that differs from the thermal expansion coefficient of the base member to which the nozzle plate is to be bonded by $1E^{-6}/°C$ to $1E^{-8}/°C$. The discharge ports may be bored through the nozzle plate by means of etching, machining, and laser processing.

The base member 41 and the nozzle plate 52 may be bonded by means of an organic adhesive agent, although they are preferably bonded by metallic bonding, using an inorganic material. Materials that can be used for metallic bonding include In, Au, Cu, Ni, Pb, Ti and Cr. Any of these metals can bond the base member and the nozzle plate at low temperature not higher than 250° C. and the thermal expansion coefficient thereof shows a small difference from the thermal expansion coefficient of the base member so that it can avoid the problem of warping if the liquid discharge head is made long and hence suppress damages to the piezoelectric substrates if such damages arise.

A liquid discharge head comprising piezoelectric elements and hence piezoelectric substrates according to the present invention will be described further below by way of examples. The technical scope of the piezoelectric substrates, piezoelectric elements and liquid discharge head using the piezoelectric elements is by no means limited to the examples described below.

Specimens of liquid discharge head according to the present invention were prepared as described below.

EXAMPLE 1

Firstly, a vibration plate was prepared by forming a film of stabilized zirconia YSZ ($Y_2O_3$—$ZrO_2$) on an open section of an Si substrate by means of a sputtering system (L-210-FH (available from ANELVA)). In this process, the Si substrate was heated to 800° C. and Ar and $O_2$ were used as gas to be ionized. Electric power of 100 W was applied between the Si substrate and the target and the internal pressure of the system was held to 1.0 Pa. As a result, a 200 nm thick uniaxial vibration plate was obtained.

Then, a process same as that of preparing the vibration plate was used to prepare a lower electrode. In this process, Pt was used as target and the substrate was heated to 600° C., while Ar was used as gas to be ionized. Electric power of 100 W was applied between the vibration plate and the target and the internal pressure of the system was held to 0.5 Pa. As a result, a 400 nm thick highly uniaxial Pt film was obtained.

Subsequently, films of two different oxides having respective target compositions (1) and (2) as listed below were formed on the substrate by means of the above described sputtering system, placing the aperture of the shutter vis-à-vis one of the composition regions of the target, holding it for a predetermined time period, then sliding the aperture of the shutter to place it vis-à-vis the other composition region of the target and holding it for a predetermined time period. This process was repeated to form 20 layers of each of the two different compositions, or the crystal phases, in an alternate manner, the crystal phases being separated by boundary layers having a crystal structure that changes gradually. A piezoelectric substrate was obtained as a result. In this process, the substrate was heated to 650° C., while Ar and $O_2$ were used as gas to be ionized. Electric power of 100 W was applied between the electrode and the target and the internal pressure of the system was held to 0.5 Pa. The sputtering time was 8 minutes for both the target composition (1) and the target composition (2) and 2 minutes were spent to form a boundary layer, while moving the aperture of the shutter from one of the compositions to the other. As a result, a piezoelectric substrate having a film thickness of 300 nm and comprising layers of the tetragonal structure and the rhombohedral structure and boundary layers that were mixed layers of the two structures was obtained, as shown in FIG. 1.

Target Compositions

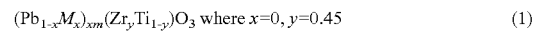

$$(Pb_{1-x}M_x)_{xm}(Zr_yTi_{1-y})O_3 \text{ where } x=0, y=0.45 \qquad (1)$$

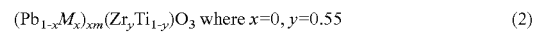

$$(Pb_{1-x}M_x)_{xm}(Zr_yTi_{1-y})O_3 \text{ where } x=0, y=0.55 \qquad (2)$$

Subsequently, an upper electrode was prepared by way of a process similar to that of preparing the lower electrode.

Then, the Si substrate was subjected to a dry etching process by means of ICP from the surface opposite to the surface where the vibration plate 42 was arranged to remove a central part and produce a recess. At this time, the temperature of the substrate was held to 20° C. and gases of $SF_6$ and $C_4F_8$ were used, while the high frequency coil was operated by RF induction with 1,800 W and the internal pressure of the system was held to 4.0 Pa. A nozzle plate made of Si and provided with a liquid discharge port 53 was bonded to the Si substrate where a recess had been formed by means of an Si—Si bonding process. In this way, a liquid discharge head comprising a piezoelectric element with a 5,000 μm long and 100 μm wide vibration plate was prepared.

The piezoelectric element and the liquid discharge head that were obtained in Example 1 were tested to observe the displacement of the piezoelectric element, the quantity of discharged liquid droplets and the speed of discharge of liquid droplets when the applied voltage was 20 V and the frequency was 10 kHz. Tables 1 and 2 summarily show the obtained results.

EXAMPLE 2

A liquid discharge head was prepared by following the process of Examples 1 and 2 except that the target compositions as listed below were used for preparing the piezoelectric substrate and a target as illustrated in FIG. 6 was used. As shown in FIG. 6, the target compositions (1) through (3) were arranged in the respective target regions formed by dividing the target by three as materials of the piezoelectric substrate. The sputtering time was 15 minutes, 13 minutes and 11 minutes for the three regions of the different compositions and 4 minutes were spent to form a boundary layer, while moving the aperture of the shutter from one of the compositions to the other. As a result, a piezoelectric substrate comprising 20 layers of the tetragonal structure and 20 layers of the rhombohedral structure and 20 MPB layers that were mixed layers of the two structures was obtained. Thus, it is possible to form a piezoelectric body having different film thicknesses for layers of different crystal phases as shown in FIG. 2 by differentiating the film forming time for the crystal phases.

Target Compositions

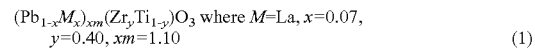

$$(Pb_{1-x}M_x)_{xm}(Zr_yTi_{1-y})O_3 \text{ where } M=La, x=0.07, y=0.40, xm=1.10 \qquad (1)$$

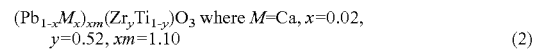

$$(Pb_{1-x}M_x)_{xm}(Zr_yTi_{1-y})O_3 \text{ where } M=Ca, x=0.02, y=0.52, xm=1.10 \qquad (2)$$

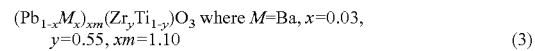

$$(Pb_{1-x}M_x)_{xm}(Zr_yTi_{1-y})O_3 \text{ where } M=Ba, x=0.03, y=0.55, xm=1.10 \qquad (3)$$

The piezoelectric element and the liquid discharge head that were obtained in Example 2 were tested to observe the displacement of the piezoelectric element, the quantity of discharged liquid droplets and the speed of discharge of liquid droplets as in Example 1. Tables 1 and 2 summarily show the obtained results.

EXAMPLE 3

A liquid discharge head was prepared by following the process of Examples 1 and 2 except that the target compositions (1) through (4) as listed below were used for preparing the piezoelectric substrate and a target where the materials of the piezoelectric substrate were arranged in the respective target regions was formed by dividing the target by four. The sputtering time was 24 minutes, 24 minutes, 24 minutes, 30 minutes, 24 minutes and 36 minutes for the regions of the different compositions and 6 minutes were spent to form a boundary layer, while moving the aperture of the shutter from one of the compositions to the other. As a result, a piezoelectric substrate comprising 10 layers of each of the six structures including the tetragonal structure, the rhombohedral structure, the tetragonal structure, the pseudocubic structure, the tetragonal structure and the monoclinic structure was obtained. Thus, it is possible to form a piezoelectric substrate having desired film thicknesses for respective layers of a plurality of crystal phases by differentiating the quota regions on the target and the sputtering time.

Target Compositions

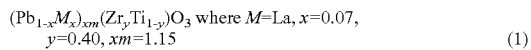

$(Pb_{1-x}M_x)_{xm}(Zr_yTi_{1-y})O_3$ where $M$=La, $x$=0.07, $y$=0.40, $xm$=1.15    (1)

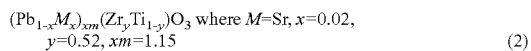

$(Pb_{1-x}M_x)_{xm}(Zr_yTi_{1-y})O_3$ where $M$=Sr, $x$=0.02, $y$=0.52, $xm$=1.15    (2)

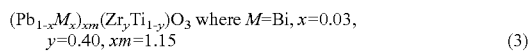

$(Pb_{1-x}M_x)_{xm}(Zr_yTi_{1-y})O_3$ where $M$=Bi, $x$=0.03, $y$=0.40, $xm$=1.15    (3)

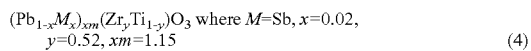

$(Pb_{1-x}M_x)_{xm}(Zr_yTi_{1-y})O_3$ where $M$=Sb, $x$=0.02, $y$=0.52, $xm$=1.15    (4)

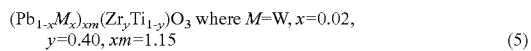

$(Pb_{1-x}M_x)_{xm}(Zr_yTi_{1-y})O_3$ where $M$=W, $x$=0.02, $y$=0.40, $xm$=1.15    (5)

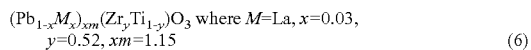

$(Pb_{1-x}M_x)_{xm}(Zr_yTi_{1-y})O_3$ where $M$=La, $x$=0.03, $y$=0.52, $xm$=1.15    (6)

It may be safe to assume that (2), (4) and (6) respectively took the form of the rhombohedral structure, that of pseudocubic structure and that of the monoclinic structure because the film forming time was 8 minutes, 10 minutes and 12 minutes for (2), (4) and (6) where the quantity of Zr was 0.52 and the stress applied to the film was differentiated.

The piezoelectric element and the liquid discharge head that were obtained in Example 3 were tested to observe the displacement of the piezoelectric element, the quantity of discharged liquid droplets and the speed of discharge of liquid droplets as in Examples 1 and 2. Tables 1 and 2 summarily show the obtained results.

COMPARATIVE EXAMPLE 1

A liquid discharge head was prepared by following the process of Examples 1, 2 and 3 except that the values of x=0 and y=0.50 and a sintered substrate were used for the target composition of $(Pb_{1-x}M_x)(Zr_yTi_{1-y})O_3M$ for preparing the piezoelectric substrate of the example and the substrate was heated to 600° C. As a result, a polycrystalline piezoelectric substrate where the crystal phases of the tetragonal structure and the rhombohedral structure coexist as mixture was obtained.

The piezoelectric element and the liquid discharge head that were obtained in Comparative Example 1 were tested to observe the displacement of the piezoelectric element, the quantity of discharged liquid droplets and the speed of discharge of liquid droplets as in Examples 1, 2 and 3.

The displacement of the piezoelectric element of Example 1 was 0.40 nm, that of the piezoelectric element of Example 2 was 0.55 nm and that of the piezoelectric element of Example 3 was 0.54 nm, whereas the displacement of the piezoelectric element of Comparative Example 1 that comprised only a mixed layer of the tetragonal structure and the rhombohedral structure was 0.35 nm.

The quantity of discharged liquid droplets of the liquid discharge head was 17 pl and the discharge speed was 14 m/sec in Example 1 when a voltage of 20 V was applied to the liquid discharge head (10 kHz). The quantity of discharged liquid droplets of the liquid discharge head was 19 pl and the discharge speed was 16 m/sec in Example 2 when a voltage of 20 V was applied to the liquid discharge head (10 kHz). The quantity of discharged liquid droplets of the liquid discharge head was 19 pl and the discharge speed was 15 m/sec in Example 3 when a voltage of 20 V was applied to the liquid discharge head (10 kHz). On the other hand, the quantity of discharged liquid droplets of the liquid discharge head was 16 pl and the discharge speed was 13 m/sec in Comparative Example 1. Apparently, both the quantity of discharged liquid droplets and the discharge speed of the liquid discharge head of Comparative Example 1 were inferior relative to those of Examples 1 through 3.

The liquid discharge heads were subjected to a durability test. The liquid discharge heads of Examples 1 through 3 did not give rise to any nozzle incapable of discharging liquid after $10^9$ operations. On the other hand, the liquid discharge head of Comparative Example 1 produced film exfoliation and a nozzle incapable of discharging liquid any more after $10^6$ to $10^7$ operations. Thus, according to the present invention, it is possible to provide a piezoelectric element that is highly durable and practically free from film exfoliation.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2005-241378, filed Aug. 23, 2005, which is hereby incorporated by reference herein in its entirety.

What is claimed is:

1. A method for manufacturing a piezoelectric substrate, the piezoelectric substrate of a perovskite-type oxide expressed by a general formula of $ABO_3$ having a single crystal structure or a uniaxial crystal structure expressed by $(Pb_{1-x}M_x)_{xm}(Zr_yTi_{1-y})O_3$, where M represents an element selected from La, Ca, Ba, Sr, Bi, Sb and W, the piezoelectric substrate having a structure layered above a substrate, the layered structure having a first crystal phase layer provided at a side nearest to the substrate and having a tetragonal crystal structure, a second crystal phase layer having a crystal structure selected from a rhombohedral structure, a pseudocubic structure and a monoclinic structure, and a boundary layer arranged between said the first crystal phase layer and the second crystal phase layer, a crystal structure of the boundary layer gradually changing in a thickness direction of the boundary layer, the method performing in the following order:

a forming step of the first crystal phase layer by performing sputtering using a material of the first crystal phase layer as a target, an amount of Ti contained in the material of the first crystal phase layer being more than that contained in a material of the second crystal phase layer and that contained in a material of the boundary layer;

a forming step of the boundary layer by performing sputtering while gradually changing a material of the target from the material of the first crystal phase layer to that of the second crystal phase layer; and a forming step of the second crystal phase layer by performing sputtering using the material of the second crystal layer as the target.

2. The method according to claim 1, wherein $0.45 \leqq y < 1$.

3. The method according to claim 1, further comprising a step of performing sputtering while gradually changing a material of the target from the material of the second crystal phase layer to that of the first crystal phase layer after the forming step of the second crystal phase layer.

* * * * *